United States Patent
Kanuma

(10) Patent No.: US 7,334,171 B2
(45) Date of Patent: Feb. 19, 2008

(54) TEST PATTERN GENERATING APPARATUS, CIRCUIT DESIGNING APPARATUS, TEST PATTERN GENERATING METHOD, CIRCUIT DESIGNING METHOD, TEST PATTERN GENERATING PROGRAM AND CIRCUIT DESIGNING PROGRAM

(75) Inventor: Akira Kanuma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 121 days.

(21) Appl. No.: 11/060,504

(22) Filed: Feb. 18, 2005

(65) Prior Publication Data

US 2006/0156138 A1 Jul. 13, 2006

(30) Foreign Application Priority Data

Nov. 29, 2004 (JP) .............................. 2004-343279

(51) Int. Cl.
*G01R 31/28* (2006.01)
(52) U.S. Cl. ..................................................... 714/724
(58) Field of Classification Search ......... 714/100–824
See application file for complete search history.

(56) References Cited

U.S. PATENT DOCUMENTS

| | | | | |
|---|---|---|---|---|
| 4,744,047 A * | 5/1988 | Okamoto et al. | ............ | 382/147 |
| 4,759,021 A * | 7/1988 | Kawaguchi et al. | ........ | 714/743 |
| 5,862,149 A * | 1/1999 | Carpenter et al. | .......... | 714/726 |
| 6,205,567 B1 * | 3/2001 | Maruyama | .................. | 714/741 |
| 6,233,182 B1 * | 5/2001 | Satou et al. | ................ | 365/200 |
| 6,510,535 B1 * | 1/2003 | Hosokawa et al. | ......... | 714/726 |
| 6,557,128 B1 * | 4/2003 | Turnquist | .................... | 714/724 |
| 6,664,972 B2 * | 12/2003 | Eichel et al. | ................ | 345/582 |
| 6,708,166 B1 * | 3/2004 | Dysart et al. | .................. | 707/6 |
| 6,751,767 B1 * | 6/2004 | Toumiya | ...................... | 714/738 |
| 6,789,222 B2 * | 9/2004 | Buckley, Jr. | ................. | 714/738 |
| 6,862,717 B2 * | 3/2005 | Nadeau-Dostie et al. | ...... | 716/4 |
| 6,922,803 B2 * | 7/2005 | Nakao et al. | ................ | 714/738 |
| 2002/0091980 A1 * | 7/2002 | Buckley, Jr. | ................. | 714/738 |
| 2002/0170009 A1 * | 11/2002 | Barnhart | ...................... | 714/726 |
| 2004/0012580 A1 * | 1/2004 | Yamagishi et al. | ......... | 345/204 |
| 2004/0015749 A1 * | 1/2004 | Ziegler et al. | .............. | 714/701 |
| 2004/0139070 A1 * | 7/2004 | Dysart et al. | .................. | 707/3 |
| 2005/0262410 A1 * | 11/2005 | Parvathala et al. | ......... | 714/738 |
| 2006/0161828 A1 * | 7/2006 | Lin | ............................. | 714/738 |

FOREIGN PATENT DOCUMENTS

| | | |
|---|---|---|
| JP | 3-202790 | 9/1991 |
| JP | 11-083958 | 3/1999 |
| JP | 11-287847 | 10/1999 |

\* cited by examiner

*Primary Examiner*—Jacques Louis-Jacques
*Assistant Examiner*—Merant Guerrier
(74) *Attorney, Agent, or Firm*—Staas & Halsey LLP

(57) ABSTRACT

A test pattern generating apparatus comprises a circuit data read in section 11 that divides circuit data into a plurality of functional blocks, a correspondence setting up table preparing section 12 that sorts the plurality of functional blocks into test pattern generating object blocks and test pattern copying object blocks that are configurationally identical with the test pattern generating object blocks and sets up correspondence of the test pattern generating object blocks to the test pattern copying object blocks, a test pattern generating section 13 that generates a test pattern of each of the test pattern generating object blocks and a test pattern copying section 14 that copies the test pattern of each of the test pattern copying object blocks and uses it as test pattern of the test pattern copying object block.

12 Claims, 6 Drawing Sheets

FIG. 5

| TEST PATTERN GENERATING OBJECT BLOCK | SETTING UP CORRESPONDENCE | TEST PATTERN COPYING OBJECT BLOCK |
|---|---|---|
| FUNCTIONAL BLOCK A-FF1 | → | FUNCTIONAL BLOCK B-FF1 |
| FUNCTIONAL BLOCK A-FF2 | → | FUNCTIONAL BLOCK B-FF2 |
| FUNCTIONAL BLOCK A-FF3 | → | FUNCTIONAL BLOCK B-FF3 |
| : | : | : |
| FUNCTIONAL BLOCK A-FFm | → | FUNCTIONAL BLOCK B-FFm |
| FUNCTIONAL BLOCK C-FF1 | | |
| FUNCTIONAL BLOCK C-FF2 | | |
| FUNCTIONAL BLOCK C-FF3 | | |
| : | | |
| FUNCTIONAL BLOCK C-FFn | | |

TEST PATTERN GENERATING APPARATUS, CIRCUIT DESIGNING APPARATUS, TEST PATTERN GENERATING METHOD, CIRCUIT DESIGNING METHOD, TEST PATTERN GENERATING PROGRAM AND CIRCUIT DESIGNING PROGRAM

BACKGROUND OF THE INVENTION

1. Field of the Invention

This invention relates to a test pattern generating apparatus, a circuit designing apparatus, a test pattern generating method, a circuit designing method, a test pattern generating program and a circuit designing program for generating test patterns to be used for judging if a manufactured LSI is acceptable or unacceptable from the circuit data of the designed LSI.

2. Description of Related Art

Firstly, a known test pattern generating apparatus will be described by referring to FIG. 7 of the accompanying drawings. FIG. 7 is a schematic block diagram of a known test pattern generating apparatus, showing its configuration. The test pattern generating apparatus 102 comprises a circuit data read in section 11 and a test pattern generating section 13. The circuit data read in section 11 is connected to an external circuit data storage section 1 while the test pattern generating section 13 is connected to an external test pattern storage section 3.

Now, the operation of the known test pattern generating apparatus will be described below. The circuit data of a designed LSI is stored in the circuit data storage section 1. The circuit data read in section 11 reads in the circuit data from the circuit data storage section 1 and prepares an FF (flip flop) list showing flip flops sorted for each functional block. The prepared FF list is output to the test pattern generating section 13. Then, the test pattern generating section 13 generates a test pattern for each functional block according to the FF list and stores the generated test patterns in the test pattern storage section 3.

Known techniques relating to the present invention include one described in Japanese Patent Application Laid-Open Publication No. 11-287847 (pp 3-5, FIG. 1), which discloses a test pattern preparing apparatus. The disclosed test pattern preparing apparatus can reduce the total volume of data necessary for managing test patterns and improve the efficiency of the operation of modifying test patterns as it is adapted to prepare a test pattern by combining block patterns according to configuration information.

However, the known test pattern generating apparatus generates test patterns for all the functional blocks without discriminating the internals of functional blocks. Since the number of functional blocks and that of gates mounted in an LSI are ever increasing, there arises a problem that the processing time and the occupied memory area increase explosively if test patterns are generated for all the functional blocks.

SUMMARY OF THE INVENTION

In view of the above identified problem, it is therefore the object of the present invention to provide a test pattern generating apparatus, a circuit designing apparatus, a test pattern generating method, a circuit designing method, a test pattern generating program and a circuit designing program for generating a test pattern that reduce the processing time and the occupied memory area for generating test patterns.

In an aspect of the present invention, the above object is achieved by providing a test pattern generating apparatus adapted to generate test patterns of a circuit, the apparatus comprising: a circuit data read in section that reads in circuit data and divides the circuit data into a plurality of functional blocks; a correspondence setting up section that sorts the plurality of functional blocks into test pattern generating object blocks that are objects of the operation of generating a test pattern and test pattern copying object blocks other than the test pattern generating object blocks that are configurationally identical with the test pattern generating object blocks and sets up correspondence of the test pattern generating object blocks to the test pattern copying object blocks; a test pattern generating section that generates a test pattern of each of the test pattern generating object blocks; and a test pattern copying section that copies the test pattern of each of the test pattern generating object blocks whose correspondence to the test pattern copying object blocks are set up and uses it as test pattern of the test pattern copying object block.

Preferably, in a test pattern generating apparatus according to the invention, the circuit data read in section prepares a list of flip flops of each functional block and the correspondence setting up section prepares a table setting up correspondence of the test pattern generating object blocks to the test pattern copying object blocks according to the flip flop lists.

Preferably, in a test pattern generating apparatus according to the invention, the correspondence setting up section performs a pattern matching operation according to the flip flop list and recognizes functional blocks that are configurationally identical.

In another aspect of the present invention, there is provided a circuit designing apparatus adapted to design a circuit and generate test patterns of the circuit, the apparatus comprising: a circuit designing section that prepares circuit data according to instructions of the user; a circuit data read in section that reads in the circuit data and divides the circuit data into a plurality of functional blocks; a correspondence setting up section that sorts the plurality of functional blocks into test pattern generating object blocks that are objects of the operation of generating a test pattern and test pattern copying object blocks other than the test pattern generating object blocks that are configurationally identical with the test pattern generating object blocks and sets up correspondence of the test pattern generating object blocks to the test pattern copying object blocks; a test pattern generating section that generates a test pattern of each of the test pattern generating object blocks; and a test pattern copying section that copies the test pattern of each of the test pattern generating object blocks whose correspondence to the test pattern copying object blocks are set up and uses it as test pattern of the test pattern copying object block.

In still another aspect of the present invention, there is provided a test pattern generating method adapted to generate test patterns of a circuit, the method comprising: reading in circuit data and divides the circuit data into a plurality of functional blocks; sorting the plurality of functional blocks into test pattern generating object blocks that are objects of the operation of generating a test pattern and test pattern copying object blocks other than the test pattern generating object blocks that are configurationally identical with the test pattern generating object blocks and setting up correspondence of the test pattern generating object blocks to the test pattern copying object blocks; generating a test pattern of each of the test pattern generating object blocks; and copying the test pattern of each of the test pattern generating object blocks whose correspondence to the test pattern copying object blocks are set up and using it as test pattern of the test pattern copying object block.

Preferably, in a test pattern generating method according to the invention, the reading in circuit data includes preparing a list of flip flops of each functional block and the setting up correspondence includes preparing a table that sets up correspondence of the test pattern generating object blocks to the test pattern copying blocks according to the flip flop lists.

Preferably, in a test pattern generating method according to the invention, the setting up correspondence includes performing a pattern matching operation according to the flip flop list and recognizing functional blocks that are configurationally identical.

In still another aspect of the present invention, there is provided a circuit designing method adapted to design a circuit and generate test patterns of the circuit, the method comprising: preparing circuit data according to instructions of the user; reading in circuit data and dividing the circuit data into a plurality of functional blocks; sorting the plurality of functional blocks into test pattern generating object blocks that are objects of the operation of generating a test pattern and test pattern copying object blocks other than the test pattern generating object blocks that are configurationally identical with the test pattern generating object blocks and setting up correspondence of the test pattern generating object blocks to the test pattern copying object blocks; generating a test pattern of each of the test pattern generating object blocks; and copying the test pattern of each of the test pattern generating object blocks whose correspondence to the test pattern copying object blocks are set up and using it as test pattern of the test pattern copying object block.

In still another aspect of the present invention, there is provided a test pattern generating program adapted to have a computer execute a test pattern generating method of generating test patterns of a circuit, the program comprising: reading in circuit data and divides the circuit data into a plurality of functional blocks; sorting the plurality of functional blocks into test pattern generating object blocks that are objects of the operation of generating a test pattern and test pattern copying object blocks other than the test pattern generating object blocks that are configurationally identical with the test pattern generating object blocks and setting up correspondence of the test pattern generating object blocks to the test pattern copying object blocks; generating a test pattern of each of the test pattern generating object blocks; and copying the test pattern of each of the test pattern generating object blocks whose correspondence to the test pattern copying object blocks are set up and using it as test pattern of the test pattern copying object block.

Preferably, in a test pattern generating program according to the invention, the reading in circuit data includes preparing a list of flip flops of each functional block and the setting up correspondence includes preparing a table that sets up correspondence of the test pattern generating object blocks to the test pattern copying object blocks according to the flip flop lists.

Preferably, in a test pattern generating program according to the invention, the setting up correspondence includes performing a pattern matching operation according to the flip flop list and recognizing functional blocks that are configurationally identical.

In a further aspect of the present invention, there is provided a circuit designing program adapted to have a computer execute a circuit designing method of designing a circuit and generating test patterns of the circuit, the program comprising: preparing circuit data according to instructions of the user; reading in circuit data and divides the circuit data into a plurality of functional blocks; sorting the plurality of functional blocks into test pattern generating object blocks that are objects of the operation of generating a test pattern and test pattern copying object blocks other than the test pattern generating object blocks that are configurationally identical with the test pattern generating object blocks and setting up correspondence of the test pattern generating object blocks to the test pattern copying object blocks; generating a test pattern of each of the test pattern generating object blocks; and copying the test pattern of each of the test pattern generating object blocks whose correspondence to the test pattern copying object blocks are set up and using it as test pattern of the test pattern copying object block.

Thus, according to the invention, the processing time and the occupied memory area for generating test patterns are reduced at the time of generating test patterns by curtailing the circuit that provides the object of an operation of generating test patterns.

BRIEF DESCRIPTION OF THE DRAWINGS

FIG. 5 is a schematic illustration of a correspondence setting up table that can be used for the purpose of the invention;

DETAILED DESCRIPTION OF THE PREFERRED EMBODIMENTS

Now, the present invention will be described by referring to the accompanying drawings that illustrate preferred embodiments of the invention.

Figure 1:
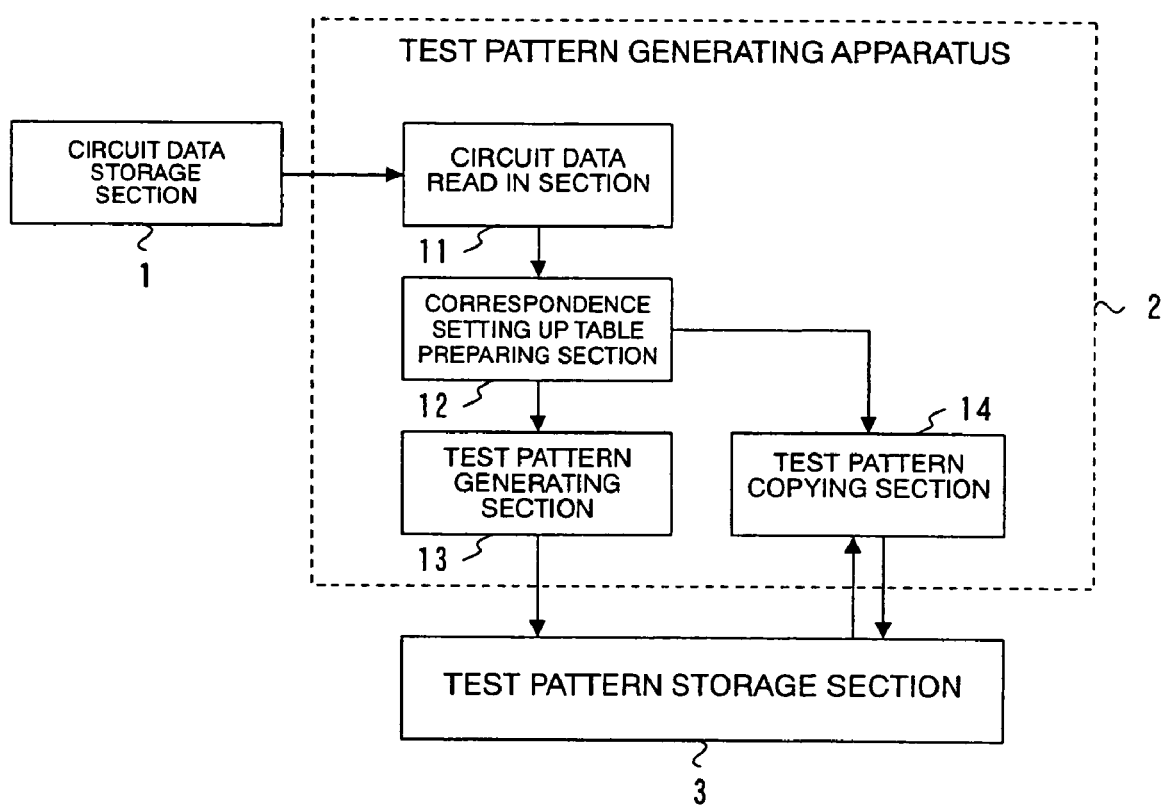
FIG. 1 is a schematic block diagram of an embodiment of test pattern generating apparatus according to the invention.
Figure 7:
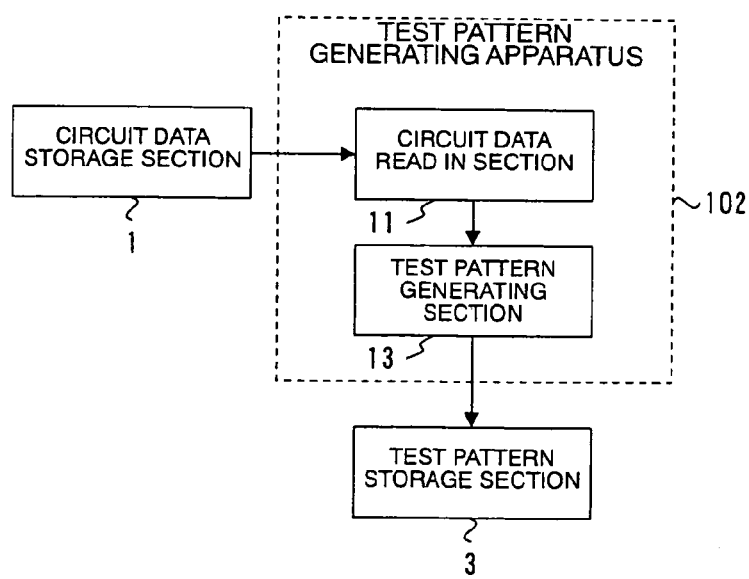
FIG. 7 is a schematic block diagram of a known test pattern generating apparatus.

Firstly, an embodiment of test pattern generating apparatus according to the invention will be described for its configuration. FIG. 1 is a schematic block diagram of the embodiment of test pattern generating apparatus. In FIG. 1, the components that are identical with or similar to those of the known apparatus of FIG. 7 are denoted respectively by the same reference symbols and will not be described here any further. FIG. 1 illustrates a test pattern generating apparatus 2 according to the invention, whereas FIG. 7 illustrates a known test pattern generating apparatus 102. It will be seen by comparing the known test pattern generating apparatus 102 and the test pattern generating apparatus 2 according to the invention, the latter apparatus comprises a correspondence setting up table preparing section 12 and a test pattern copying section 14 that the former apparatus does not comprise.

Figure 2:
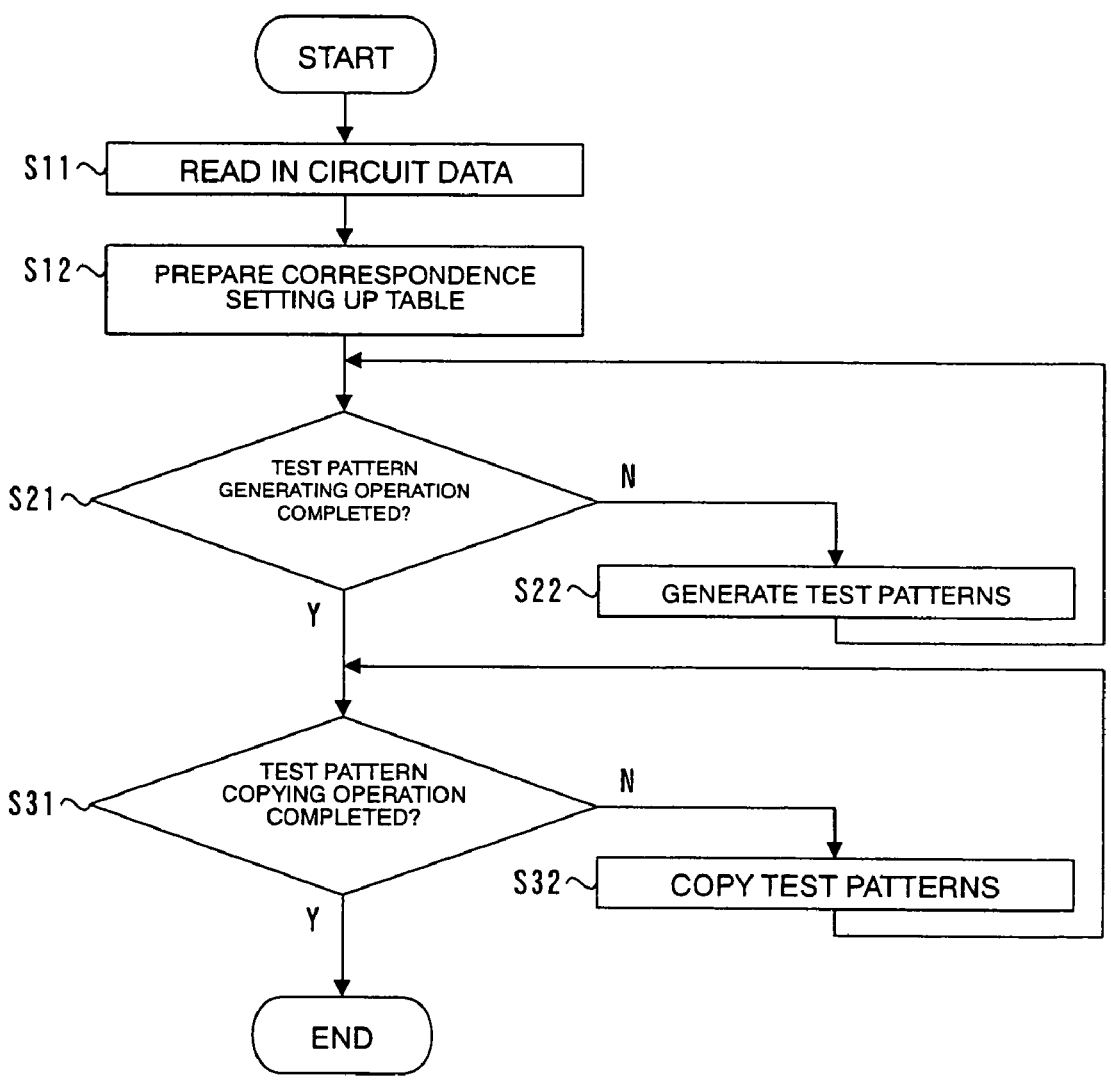
FIG. 2 is a flow chart of the operation of the embodiment of test pattern generating apparatus.

Now, the operation of the test pattern generating apparatus according to the invention will be described below. FIG. 2 is a flow chart of the operation of the embodiment of test pattern generating apparatus. Firstly, the circuit data read in section 11 reads in circuit data from a circuit data storage section 1 and prepares an FF list that sorts out similar functional blocks (S11).

Figure 3:
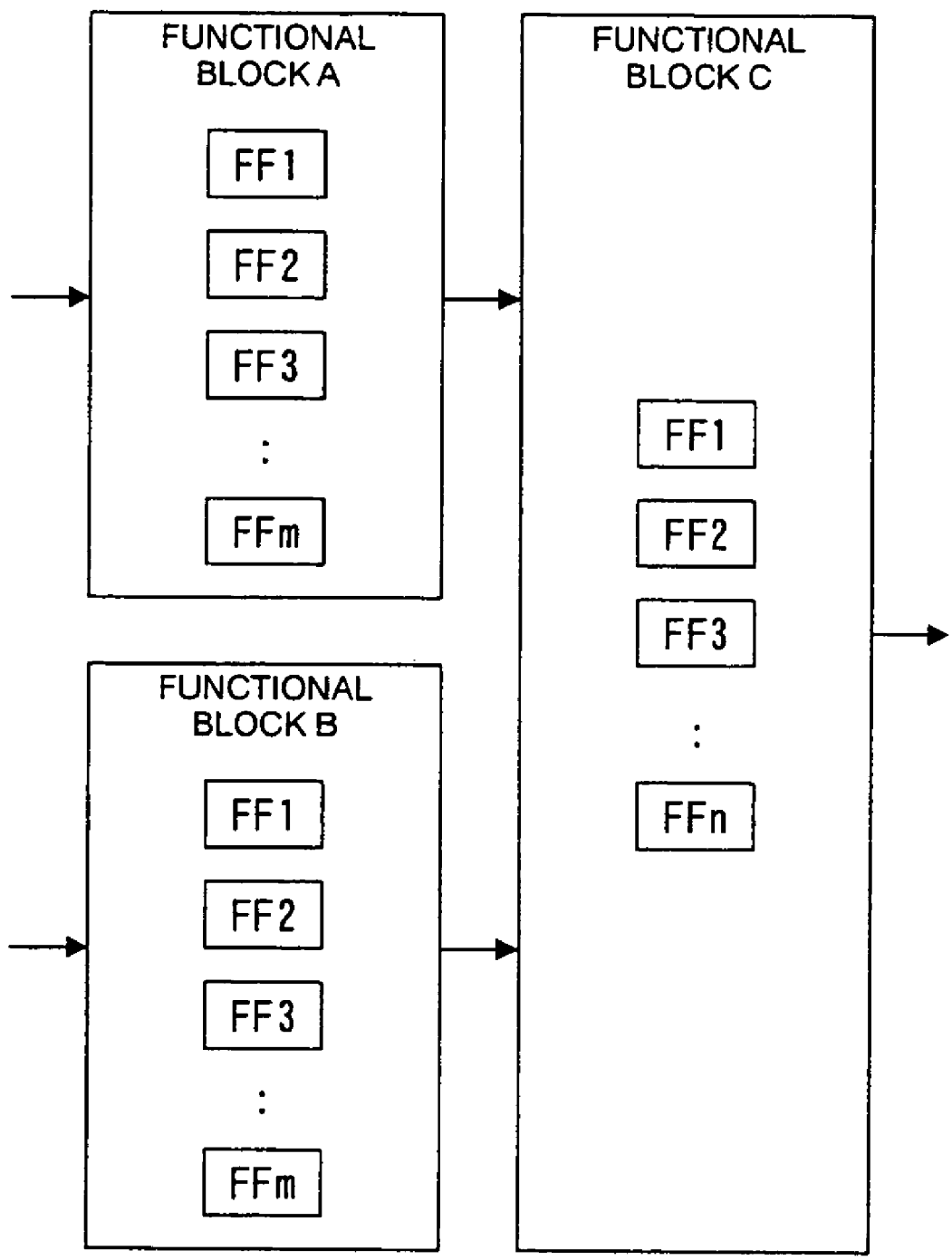
FIG. 3 is a schematic illustration of blocks of circuit data that can be used for the purpose of the invention.
Figure 4:
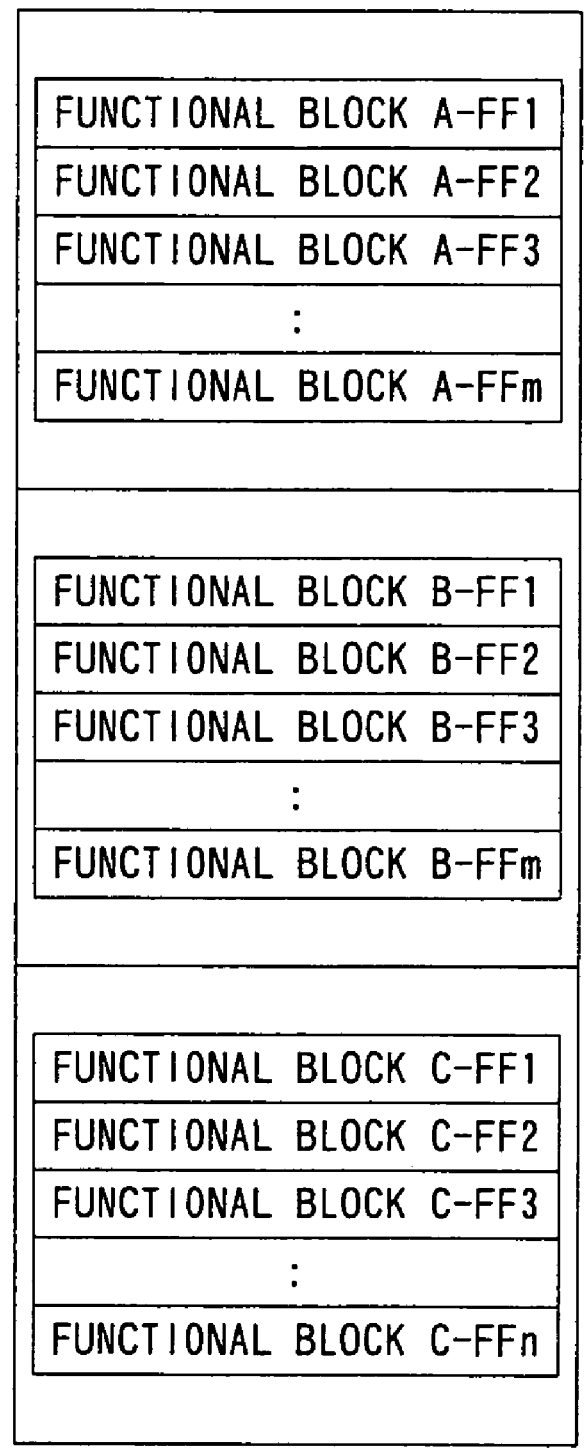
FIG. 4 is a schematic illustration of an FF list that can be used for the purpose of the invention.

The accompanying drawings also illustrate circuit data and an FF list that can be used for the purpose of the present invention. FIG. 3 is a schematic illustration of blocks of circuit data that can be used for the purpose of the invention. The circuit data of FIG. 3 include functional block A, functional block B and functional block C. The functional block A includes m FFs and the functional block B has a configuration same as that of the functional block A. The functional block C covers the component circuits other than those of the functional blocks A and B and includes n FFs. FIG. 4 is a schematic illustration of an FF list that can be used for the purpose of the invention. The FF list of FIG. 4 is prepared from the circuit data of FIG. 3.

Then, the correspondence setting up table preparing section 12 recognizes functional blocks that are configurationally identical in the FF list and prepares a correspondence setting up table showing the result of setting up correspondence of input/output pins to FFs (S12). Functional blocks that are configurationally identical are recognized typically by means of pattern matching. In the correspondence setting up table, the functional blocks are sorted into test pattern generating object blocks and test pattern copying object blocks. The expression of a test pattern generating object block as used herein refers to a functional block that requires generation of a test pattern, whereas the expression of a test pattern copying object block as used herein refers to a functional block that is configurationally identical with a test pattern generating object block. Correspondence of the FFs in the functional block A to those in the functional block B is also set up.

FIG. 5 is a schematic illustration of a correspondence setting up table that can be used for the purpose of the invention. The correspondence setting up table is prepared from the FF list of FIG. 4. In FIG. 5, a functional block A and a functional block C are test pattern generating object blocks and a functional block B is a test pattern copying object block. Correspondence of the functional block A to the functional block B that is configurationally identical with the functional block A is established.

Then, the test pattern generating section 13 determines if the operation of generating test patterns for all the test pattern generating object blocks is completed or not (S21). If the operation of generating test patterns is not completed (S21, N), the test pattern generating section 13 generates a test pattern for each and every test pattern generating object block (S22) and stores the generated test patterns in the test pattern storage section 3 before it returns to the processing step S21.

If, on the other hand, the operation of generating test patterns is completed (S21, Y), the test pattern copying section 14 determines if the operation of copying test patterns for all the test pattern copying object blocks is completed or not (S31). If the operation of copying test patterns is not completed (S31, N), the test pattern copying section 14 copies a test pattern for each and every test pattern generating object block whose correspondence to the test pattern copying object block to the test pattern copying block from the test pattern storage section 3 and stores it in the test pattern storage section 3 as test pattern of the test pattern copying object block (S32). If, on the other hand, the operation of copying test patterns is completed (S31, Y), the entire operation of the flow chart ends.

As a result of the above described operation, the test patterns of all the functional blocks are stored in the test pattern storage section 3. However, the process of actually generating a test pattern is carried out only for each and every test pattern generating object block. In recent years, there has been a trend that the number of functional blocks that are common to a single LSI is increasing. Thus, the larger the number of common functional blocks, the more can the present invention reduce the processing time and the occupied memory area.

Figure 6:
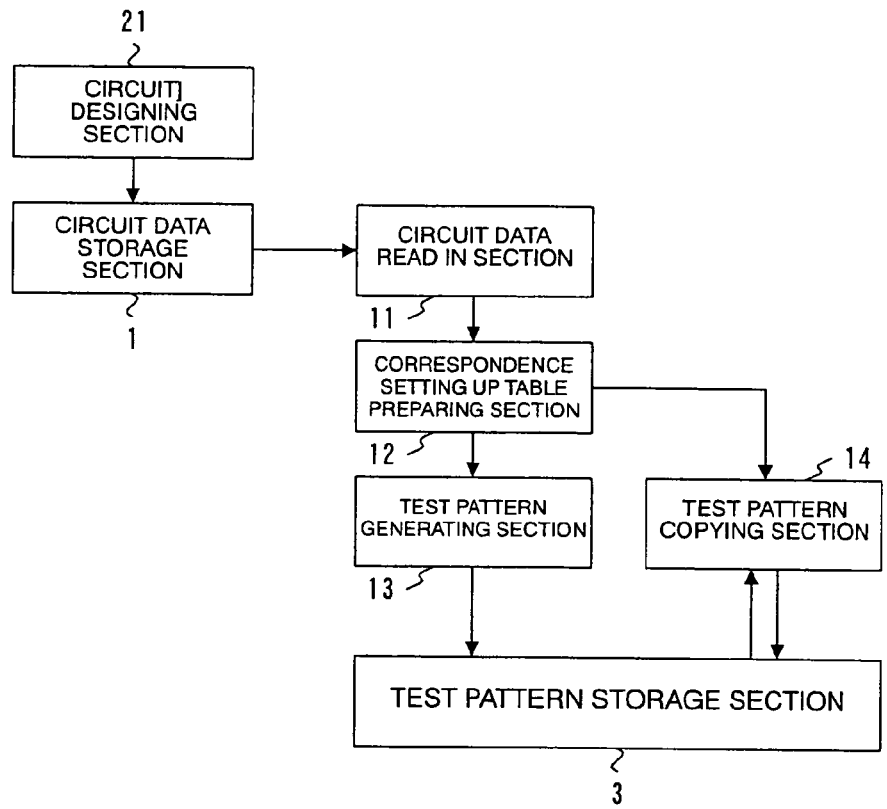
FIG. 6 is a schematic block diagram of an embodiment of circuit designing apparatus according to the invention.

While only a test pattern generating apparatus according to the invention is described above, a test pattern generating apparatus according to the invention may be part of a circuit designing apparatus for designing LSIs. FIG. 6 is a schematic block diagram of an embodiment of circuit designing apparatus according to the invention. In FIG. 6, the components same as those of FIG. 1 are denoted respectively by the same reference symbols and will not be described any further. The circuit designing apparatus of FIG. 6 comprises a circuit designing section 21 in addition to the components of FIG. 1. The circuit designing section 21 designs a circuit according to the instructions given by the user and stores the circuit data of the circuit in the circuit data storage section 1. All the other operation of the circuit designing apparatus is same as the operation of the above described test pattern generating apparatus.

A test pattern generating apparatus and a circuit designing apparatus according to the invention can easily applied to a computer, which may be a work station or a personal computer.

According to the invention, there are also provided a test pattern generating program and a circuit designing program that cause computers operating respectively as a test pattern generating apparatus and a circuit designing apparatus to execute the above described steps. Computers operating as a test pattern generating apparatus and a circuit designing apparatus according to the invention can execute the respective programs when they are stored in a computer-readable recording medium. Computer-readable recording mediums that can be used for the purpose of the present invention include portable recording mediums such as CD-ROMs, flexible disks, DVD disks, magneto-optical disks and IC cards, data bases holding programs, computers external to the above computers and their data bases as well as transmission mediums on communication lines.

The correspondence setting up section corresponds to the correspondence setting up table preparing section of the above-described embodiment.

What is claimed is:

1. A test pattern generating apparatus adapted to generate test patterns of a circuit, said apparatus comprising:
    a circuit data read in section that reads in circuit data and divides the circuit data into a plurality of functional blocks;
    a correspondence setting up section that sorts the plurality of functional blocks into test pattern generating object blocks that are objects of the operation of generating a test pattern of each of the test pattern generating object blocks and test pattern copying object blocks other than the test pattern generating object blocks that are configurationally identical with the test pattern generating object blocks and sets up correspondence of the test pattern generating object blocks to the test pattern copying object blocks;
    a test pattern generating section that generates the test pattern of each of the test pattern generating object blocks; and
    a test pattern copying section that, based upon the correspondence setting, copies the test pattern of each of the test pattern generating object blocks that correspond to the test pattern copying object blocks, as test patterns of each of the test pattern copying object blocks.

2. The apparatus according to claim 1, wherein the circuit data read in section prepares a list of flip flops of each functional block and the correspondence setting up section prepares a table setting up correspondence of the test pattern generating object blocks to the test pattern copying object blocks according to the flip flop lists.

3. The apparatus according to claim 2, wherein the correspondence setting up section performs a pattern matching operation according to the flip flop list and recognizes functional blocks that are configurationally identical.

4. A circuit designing apparatus adapted to design a circuit according to a user and generate test patterns of the circuit, said apparatus comprising:
    a circuit designing section that prepares circuit data according to instructions of the user;
    a circuit data read in section that reads in the circuit data and divides the circuit data into a plurality of functional blocks;
    a correspondence setting up section that sorts the plurality of functional blocks into test pattern generating object blocks that are objects of the operation of generating a test pattern of each of the test pattern generating object blocks and test pattern copying object blocks other than the test pattern generating object blocks that are configurationally identical with the test pattern generating object blocks and sets up correspondence of the test pattern generating object blocks to the test pattern copying object blocks;
    a test pattern generating section that generates the test pattern of each of the test pattern generating object blocks; and
    a test pattern copying section that, based upon the correspondence setting, copies the test pattern of each of the test pattern generating object blocks that correspond to the test pattern copying object blocks, as test patterns of each of the test pattern copying object blocks.

5. A method of generating test patterns of a circuit, said method comprising:
    reading in circuit data and dividing the circuit data into a plurality of functional blocks;
    sorting the plurality of functional blocks into test pattern generating object blocks that are objects of the operation of generating a test pattern of each of the test pattern generating object blocks and test pattern copying object blocks other than the test pattern generating object blocks that are configurationally identical with the test pattern generating object blocks and setting up correspondence of the test pattern generating object blocks to the test pattern copying object blocks;
    generating the test pattern of each of the test pattern generating object blocks; and
    copying, based upon the correspondence setting, the test pattern of each of the test pattern generating object blocks that correspond to the test pattern copying object blocks, as test patterns of each of the test pattern copying object blocks.

6. The method according to claim 5, wherein the reading in circuit data includes preparing a list of flip flops of each functional block and the setting up correspondence includes preparing a table that sets up correspondence of the test pattern generating object blocks to the test pattern copying object blocks according to the flip flop lists.

7. The method according to claim 6, wherein the selling up correspondence includes performing a pattern matching operation according to the flip flop list and recognizing functional blocks that are configurationally identical.

8. A method of designing a circuit according to a user and generating test patterns of the circuit, said method comprising:
    preparing circuit data according to instructions of the user;
    reading the circuit data and dividing the circuit data into a plurality of functional blocks;
    sorting the plurality of functional blocks into test pattern generating object blocks that are objects of the operation of generating a test pattern of each of the test pattern generating object blocks and test pattern copying object blocks other than the test pattern generating object blocks that are configurationally identical with the test pattern generating object blocks and setting up correspondence of the test pattern generating object blocks to the test pattern copying object blocks;
    generating the test pattern of each of the test pattern generating object blocks; and
    copying, based upon the correspondence setting, the test pattern of each of the test pattern generating object blocks that correspond to the test pattern copying object blocks, as test patterns of each of the test pattern copying object blocks.

9. A computer readable medium having stored thereon a test pattern generating program controlling a computer to generate test patterns of a circuit according to operations comprising:
    reading in circuit data and divides the circuit data into a plurality of functional blocks;
    sorting the plurality of functional blocks into test pattern generating object blocks that are objects of the operation of generating a test pattern of each of the test pattern generating object blocks and test pattern copying object blocks other than the test pattern generating object blocks that are configurationally identical with the test pattern generating object blocks and setting up correspondence of the test pattern generating object blocks to the test pattern copying object blocks;
    generating the test pattern of each of the test pattern generating object blocks; and
    copying, base upon the correspondence setting, the test pattern of each of the test pattern generating object blocks that correspond to the test pattern copying object blocks, as test patterns of each of the test pattern copying object blocks.

10. The computer readable medium according to claim 9, wherein the reading in circuit data includes preparing a list of flip flops of each functional block and the setting up correspondence includes preparing a table that sets up correspondence of the test pattern generating object blocks to the test pattern copying object blocks according to the flip flop lists.

11. The computer readable medium according to claim 10, wherein the setting up correspondence includes performing a pattern matching operation according to the flip flop list and recognizing functional blocks that are configurationally identical.

12. A computer readable medium having stored thereon a circuit designing program controlling a computer to design a circuit according to a user and to generate test patterns of the circuit, according to operations comprising:
    preparing circuit data according to instructions of the user;
    reading the circuit data and dividing the circuit data into a plurality of functional blocks;

sorting the plurality of functional blocks into test pattern generating object blocks that are objects of the operation of generating a test pattern of each of the test pattern generating object blocks and test pattern copying object blocks other than the test pattern generating object blocks that are configurationally identical with the test pattern generating object blocks and setting up correspondence of the test pattern generating object blocks to the test pattern copying object blocks;

generating the test pattern of each of the test pattern generating object blocks; and copying, based upon the correspondence setting, the test pattern of each of the test pattern generating object blocks that correspond to the test pattern copying object blocks, and as test patterns of each of the test pattern copying object blocks.

\* \* \* \* \*

UNITED STATES PATENT AND TRADEMARK OFFICE
CERTIFICATE OF CORRECTION

PATENT NO. : 7,334,171 B2  
APPLICATION NO. : 11/060504  
DATED : February 19, 2008  
INVENTOR(S) : Akira Kanuma It is certified that error appears in the above-identified patent and that said Letters Patent is hereby corrected as shown below:

Column 7, Line 66, change "selling" to --setting--.

Column 10, Line 6, before "as" delete "and".

Signed and Sealed this

Twenty-ninth Day of July, 2008

JON W. DUDAS  
*Director of the United States Patent and Trademark Office*